US009541685B2

(12) United States Patent
Kierey et al.

(10) Patent No.: US 9,541,685 B2
(45) Date of Patent: Jan. 10, 2017

(54) METHOD FOR PRODUCING A REFLECTIVE OPTICAL COMPONENT FOR AN EUV PROJECTION EXPOSURE APPARATUS AND COMPONENT OF THIS TYPE

(71) Applicants: Carl Zeiss Laser Optics GmbH, Oberkochen (DE); Carl Zeiss SMT GmbH, Oberkochen (DE)

(72) Inventors: Holger Kierey, Aalen (DE); Heiko Siekmann, Aalen (DE); Andre Bresan, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 399 days.

(21) Appl. No.: 13/971,031

(22) Filed: Aug. 20, 2013

(65) Prior Publication Data

US 2013/0335816 A1  Dec. 19, 2013

Related U.S. Application Data

(63) Continuation of application No. PCT/EP2012/054320, filed on Mar. 13, 2012.
(Continued)

(30) Foreign Application Priority Data

Mar. 16, 2011  (DE) ......................... 10 2011 015 141

(51) Int. Cl.
  *G02B 5/08*  (2006.01)
  *G02B 5/20*  (2006.01)
  (Continued)

(52) U.S. Cl.
  CPC .............. *G02B 5/208* (2013.01); *B24B 13/00* (2013.01); *G02B 1/10* (2013.01); *G02B 5/0891* (2013.01);
  (Continued)

(58) Field of Classification Search
  CPC ......... G02B 5/208; G02B 5/0891; G02B 5/10; G02B 5/1838; G02B 5/1852; G02B 5/1857; G02B 1/10; G02B 19/00; G02B 19/0047; G02B 19/0095; G02B 19/0891; G02B 19/18; B24B 13/00; G03F 7/70316; G03F 7/70575; G03F 7/70191; G03F 7/70158; G03F 7/70958; G03F 7/7015; G03F 7/702; G21K 2201/064; G21K 2201/065; G21K 2201/067; G21K 2201/06; G21K 2201/061; G21K 1/06; G21K 1/062; G01J 3/18; G01J 3/1809; G03B 27/72
  (Continued)

(56) References Cited

U.S. PATENT DOCUMENTS 4,915,463 A  4/1990  Barbee, Jr.
6,453,005 B2  9/2002  Kaiser
(Continued)

FOREIGN PATENT DOCUMENTS

DE  10 2009 039 400  3/2011
JP  H07-072298 A  3/1995
(Continued)

OTHER PUBLICATIONS

Voronov et Al.. High efficiency multilayer blazed gratings for EUV and soft X-rays: Recent developments. Advances in X-Ray/EUV Optics and Components V. Proc. of SPIE vol. 7802, 780207. © 2010 SPIE. doi: 10.1117/12.861287.*
(Continued)

*Primary Examiner* — Bumsuk Won
*Assistant Examiner* — Collin X Beatty
(74) *Attorney, Agent, or Firm* — Fish & Richardson P.C.

(57) ABSTRACT

A method for producing a reflective optical component for an EUV projection exposure apparatus, the component hav-
(Continued)

Figure 1:
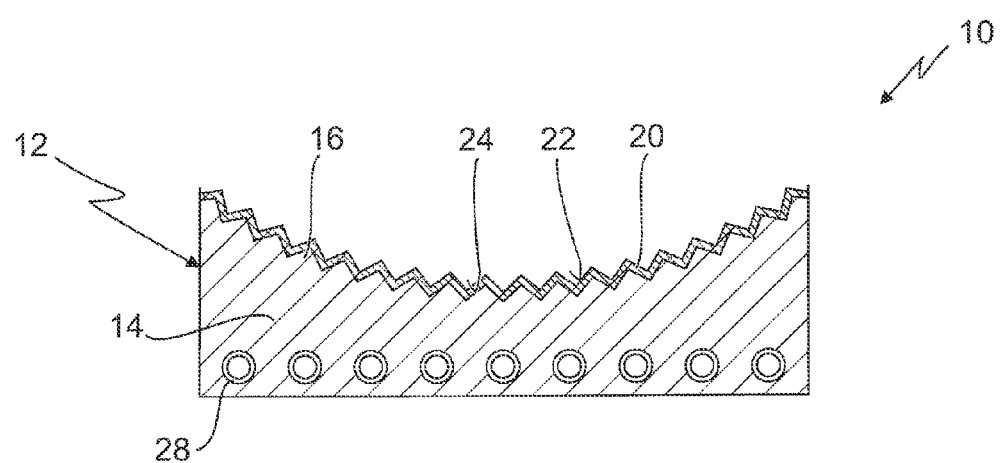

ing a substrate having a base body, and a reflective layer arranged on the substrate, wherein the substrate has an optically operative microstructuring, comprises the following steps: working the microstructuring into the substrate, polishing the substrate after the microstructuring has been worked into the substrate, applying the reflective layer to the substrate. A reflective optical component for an EUV projection exposure apparatus correspondingly has a polished surface between the microstructuring and the reflective layer.

16 Claims, 6 Drawing Sheets

Related U.S. Application Data

(60) Provisional application No. 61/453,269, filed on Mar. 16, 2011.

(51) Int. Cl.
  G02B 13/14 (2006.01)
  F21V 9/04 (2006.01)
  F21V 9/06 (2006.01)
  B24B 13/00 (2006.01)
  G02B 1/10 (2015.01)
  G02B 5/10 (2006.01)
  G02B 5/18 (2006.01)
  G03F 7/20 (2006.01)

(52) U.S. Cl.
  CPC .............. *G02B 5/10* (2013.01); *G02B 5/1838* (2013.01); *G02B 5/1852* (2013.01); *G02B 5/1857* (2013.01); *G03F 7/70316* (2013.01); *G21K 2201/064* (2013.01); *G21K 2201/065* (2013.01); *G21K 2201/067* (2013.01)

(58) Field of Classification Search
  USPC ............... 359/571, 359, 350, 558, 566, 570, 574,359/576, 634; 250/504 R; 356/328; 372/102
  See application file for complete search history.

(56) References Cited

U.S. PATENT DOCUMENTS

| | | | |
|---|---|---|---|
| 6,469,827 B1* | 10/2002 | Sweatt et al. ................. | 359/351 |
| 7,050,237 B2* | 5/2006 | Chapman ..................... | 359/574 |
| 7,129,010 B2 | 10/2006 | Alkemper et al. | |
| 7,139,127 B2* | 11/2006 | Arnold et al. ................ | 359/571 |
| 7,259,252 B2 | 8/2007 | Mirkin et al. | |
| 7,279,252 B2 | 10/2007 | Aschke et al. | |
| 7,489,386 B2 | 2/2009 | Kamm et al. | |
| 7,706,058 B2 | 4/2010 | Kandaka et al. | |
| 9,031,112 B2* | 5/2015 | Kitamura et al. ............. | 372/57 |
| 2002/0001672 A1* | 1/2002 | Pan et al. ...................... | 427/162 |
| 2004/0051954 A1* | 3/2004 | Bristol ......................... | 359/634 |
| 2005/0030656 A1 | 2/2005 | Holderer et al. | |
| 2005/0112510 A1* | 5/2005 | Bakker ......................... | 430/396 |
| 2005/0122589 A1 | 6/2005 | Bakker | |
| 2005/0180013 A1* | 8/2005 | Heidemann et al. ......... | 359/566 |
| 2005/0275818 A1* | 12/2005 | Singer ............................ | 355/55 |
| 2008/0043321 A1* | 2/2008 | Bowering et al. ............ | 359/359 |
| 2009/0027776 A1* | 1/2009 | Schall et al. .................. | 359/571 |
| 2009/0159808 A1 | 6/2009 | Bowering et al. | |
| 2009/0289205 A1* | 11/2009 | Moriya et al. ............. | 250/504 R |
| 2010/0053611 A1* | 3/2010 | Padmore et al. ............. | 356/328 |
| 2011/0051267 A1 | 3/2011 | Kierey et al. | |
| 2011/0222042 A1* | 9/2011 | Iizuka et al. .................... | 355/71 |
| 2011/0223543 A1 | 9/2011 | Banine et al. | |
| 2014/0118830 A1* | 5/2014 | Mueller et al. ............... | 359/572 |

FOREIGN PATENT DOCUMENTS

| | | | |
|---|---|---|---|
| JP | H09-171097 A | 6/1997 | |
| JP | H10-300912 A | 11/1998 | |
| JP | H11-072606 A | 3/1999 | |
| JP | 2005-536900 | 12/2005 | |
| JP | 2007-199540 A | 8/2007 | |
| JP | 2011-523782 A | 8/2011 | |
| WO | WO 2009/144117 A1 | 12/2009 | |

OTHER PUBLICATIONS

International Search Report and Written Opinion for corresponding PCT Appl No. PCT/EP2012/054320, dated Jul. 25, 2012.
Voronov D.L. et al., "High-efficiency multilayer blazed gratings for EUV and soft x-rays: recent developments," Proceedings of the SPIE—Advances in X-ray/EUV Optics and Components V, vol. 7802, Aug. 3, 2010, pp. 780207-1-780207-13.
Rastegar A et al., "Nanopit smoothing by cleaning," Proceedings of the SPIE—Alternative Lithographic Technologies, vol. 7271, Feb. 24, 2009, pp. 72710F-1-72710F-9.
Stern et al. "Enhancement of multilayer-coated normal incidence gratings in the extreme ultraviolet using a CNx smoothing layer," Proceedings of the SPIE—Future EUV.UV and Visible Space Astrophysics Missions and Instrumentation, vol. 4854, Aug. 22, 2002, pp. 61-71.
Naulleau P.P. et al., "Fabrication of high-efficiency multilayer-coated gratings for the EUV regime using e-beam patterned substrates," Optics Communications, North Holland Publishing Co., Amsterdam, NL, vol. 229, No. 1-6, Jan. 2, 2004, pp. 109-116.
Japanese Office Action, with translation thereof, for JP Appl No. 2013-558405, dated Oct. 26, 2015.
Voronov et al., "5000 Grove/mm Multilayer-Coated Blazed Grating with 33% Efficiency in the $3^{rd}$ Order in the EUV Wavelength Range", Proceedings of the SPIE, vol. 7448, Mar. 15, 2010, pp. 74480J-1-74480J-11.
Taiwanese Office Action and Search Report, with translation thereof, for corresponding TW Appl No. 101108814, dated Sep. 19, 2016.

\* cited by examiner

METHOD FOR PRODUCING A REFLECTIVE OPTICAL COMPONENT FOR AN EUV PROJECTION EXPOSURE APPARATUS AND COMPONENT OF THIS TYPE

CROSS-REFERENCE TO RELATED APPLICATIONS

The present application is a continuation of, and claims benefit under 35 USC 120 to, international application PCT/EP2012/054320, filed Mar. 13, 2012, which claims benefit under 35 USC 119 of German Application No. DE 10 2011 015 141.9, filed Mar. 16, 2011 and U.S. Provisional Application No. 61/453,269, filed Mar. 16, 2011. The entire disclosure of international application PCT/EP2012/054320 is incorporated by reference herein.

The invention relates to a method for producing a reflective optical component for an EUV projection exposure apparatus, the component having a substrate having a base body, and a reflective layer arranged on the substrate.

The invention furthermore relates to such a reflective optical component.

A reflective optical component and a method for producing the same are known e.g. from U.S. Pat. No. 7,129,010 B2.

In an EUV projection exposure apparatus, which typically operates at wavelengths in the extreme ultraviolet (EUV)—typical wavelength 13.5 nm—use is made almost exclusively of mirrors whose reflective surface has to satisfy extremely stringent requirements with regard to figure accuracy and roughness. For this purpose, mirror substrates composed of glasses such as, for example, SiO2 or composed of glass ceramics such as, for example Zerodur or ULE (a titanium silicate glass having very low expansion) are usually superpolished until the microroughness of the surface in measurements using an AFM (atomic force microscope) is typically less than 0.2 nm rms.

However, substrate materials of this type are usually very expensive and can be processed only with high outlay, e.g. by grinding, lapping and polishing. Conventional and low priced machining methods such as milling, turning or eroding, etc. cannot be used.

Substrate materials composed of glasses, glass ceramics and ceramics additionally have the disadvantage that they are only insufficiently suitable if very high thermal loads are input into the optical component e.g. on account of the incidence of high radiation powers. This is the case particularly in the application of the reflective optical component as a collector mirror for an EUV radiation source. The radiation power leading to high heat input can also result from other radiation emitted by the EUV radiation source alongside the EUV radiation, e.g. infrared radiation. In the case of the substrate materials mentioned above, the thermal conductivity of the substrate is usually too low, such that the mirror heats up greatly and its function is impaired by deformation and thermal degradation of the reflection layer.

A further problem in the case of the known reflective optical components for EUV lithography exists when reflective optical components of this type are intended to be provided with an optically operative microstructuring. In the case of reflective optical components for EUV lithography it is often desirable to provide such an optically operative microstructuring on the surface of an EUV mirror, in order that the EUV radiation reflected from the mirror can be separated from likewise reflected pump radiation, thermal radiation or UV radiation, or the microstructuring can be provided for having homogenizing or corrective effects on the EUV radiation itself.

Upon application of the customary methods for the microstructuring of surfaces, e.g. microlithography, diamond turning, holography or nano-imprint, the roughnesses of the structured surfaces generally no longer meet the requirements for an EUV mirror.

The reflective optical component for an EUV projection exposure apparatus which is known from the document U.S. Pat. No. 7,129,010 B2 cited in the introduction, which component can be a mirror or a mask, has a substrate, having a base body composed of a ceramic or glass ceramic, on which a cover layer composed of silicon dioxide is applied. The reflective layer is applied on the cover layer. In the case of this known reflective optical component an improvement is already achieved to the effect that the surface of the base body composed of ceramic or glass ceramic itself can be rough, because the cover layer composed of silicon dioxide is polished. In the case of the configuration of the component as a mask, the outer layer is structured.

U.S. Pat. No. 7,259,252 B2 discloses a method for producing a substrate of a mirror for an EUV projection exposure apparatus, wherein a base body composed of a material having a low coefficient of expansion is provided, the surface of which can be rough. A glass ceramic, e.g. Zerodur, is proposed therein as material. A cover layer composed of a semiconductor material is applied to the base body after the base body has been polished. This procedure has the disadvantages mentioned above.

U.S. Pat. No. 6,453,005 B2 discloses a mirror substrate composed of crystalline silicon, diamond or SiC, on which an amorphous layer is applied, which is suitable for superpolishing.

U.S. Pat. No. 6,469,827 B1 discloses a condenser system for an EUV projection exposure apparatus, wherein a diffraction grating, i.e. an optically operative microstructuring, is worked into a mirror of the condenser. The diffraction grating is produced on the substrate before a reflective multilayer, e.g. alternating silicon and molybdenum layers, is applied on the grating. The way in which the diffraction grating is produced on the substrate is not described in the document.

US 2008/0043321 A1 discloses a method for producing a mirror for an EUV projection exposure apparatus, wherein a plurality of circle segments of a substrate composed of SiC are provided with a multilayered coating. After assembly of the individual substrate segments, the coating is polished. The multilayers can be composed of silicon, carbon, Si3N4, B4C, SiC or chromium.

US 2009/159808 A1 discloses a method for producing a mirror for an EUV projection exposure apparatus. The method involves processing a metallic substrate at its surface by diamond turning. Afterwards, an intermediate layer is applied via physical vapour deposition, and a multilayer reflective coating is then applied. The substrate can consist of aluminium plated with nickel phosphate.

US 2009/0289205 A1 discloses an EUV collector mirror provided with a microstructuring in the form of a diffraction grating. The mirror has a substrate portion, a basis portion formed from a first composite layer arranged on one side of the substrate portion, and a reflecting portion produced by forming grooves or furrows of predetermined shapes in a second composite layer arranged on the other side of the basis portion from the substrate portion. In this case of this known optical component, therefore, the optically operative microstructuring is worked into the reflective layer after the latter has been applied. The substrate portion of the EUV collector mirror can be produced from silicon or a nickel compound having good thermal conductivity. The reflective layer consists of alternating silicon and molybdenum layers. By virtue of subsequently working the optically active microstructuring into the reflective layer, the stringent requirements made of figure accuracy and roughness at least cannot be met in a simple and cost-effective manner.

The abovementioned problem of providing a reflective optical component for an EUV exposure apparatus which has an optically operative microstructuring, and also meets the stringent requirements made of figure accuracy and roughness, has not been solved cost-effectively in the prior art.

Therefore, the invention is based on the object of developing a method for producing a reflective optical component and an optical component of the type mentioned in the introduction to the effect that the component can be provided with a desired optical property in a simple and cost-effectively producible manner and, on the other hand, the component meets the stringent requirements made of figure accuracy and roughness.

With regard to the method mentioned in the introduction for producing a reflective optical component for an EUV projection exposure apparatus, the component having a substrate having a base body, and a reflective layer arranged on the substrate, wherein the substrate has an optically operative microstructuring, the object on which the invention is based is achieved via the following steps:

working the microstructuring into the substrate, polishing the substrate after the microstructuring has been worked into the substrate, applying the reflective layer to the substrate after the substrate has been polished.

The object on which the invention is based is furthermore achieved via a reflective optical component for an EUV projection exposure apparatus, the component comprising a substrate having a base body, and a reflective layer arranged on the substrate, wherein the substrate has an optically operative microstructuring and wherein a polished surface is present between the microstructuring and the reflective surface.

The method according to the invention for producing a reflective optical component departs from the concept pursued in the prior art, namely that of working the optically active microstructuring into the substrate only after polishing, or even working the microstructuring into the reflective layer. By contrast, the method according to the invention is distinguished by the fact that the polishing step is carried out only after the microstructuring has been worked into the substrate. This has the advantage that the microstructuring that is firstly worked into the substrate does not have to meet the requirements made of the microroughness of its surface, because the requirements are then achieved by polishing the substrate. After the substrate has been polished, in the method according to the invention, the reflective layer is applied to the substrate. It goes without saying that the steps of working in the microstructuring, polishing and applying the reflective layer do not have to be carried out directly successively, rather further steps can also be interposed between them.

The reflective optical component according to the invention correspondingly has a polished surface present between the microstructuring and the reflective layer.

The optical component according to the invention can be produced cost-effectively and simply via the method according to the invention and also meets the requirements made of microroughness, without care having to be taken to ensure that the microstructuring itself already meets the requirements.

In one preferred configuration of the method, the microstructuring is worked directly into the base body.

In a corresponding configuration of the component, the microstructuring is present directly in the base body.

In this case, it is advantageous that the substrate overall can be embodied integrally or in one piece, that is to say only consists of the base body, without one or a plurality of additional layers having to be applied to the base body for working in, i.e. introducing the optically active microstructuring. This results in a saving of costs during the production of the component.

In connection with the previously mentioned configuration, in the method according to the invention and the component according to the invention it is preferably provided that the base body is produced from a material selected from the group consisting of metals, metal alloys, semiconductors and the compounds thereof, in particular aluminium, aluminium alloys, copper, copper alloys, silicon, aluminium-silicon alloys or nickel.

In this case, not only is it advantageous that the microstructuring can be produced by a conventional method for microstructuring surfaces, but this choice of material also provides for low wear of the structuring tools, e.g. during diamond turning, or during diamond fly cutting, because the abovementioned materials are sufficiently soft to be able to be processed by conventional methods for microstructuring. These materials typically exhibit good machineability.

The abovementioned materials are not only distinguished by sufficient softness that is suitable for introducing, i.e. working in a microstructuring but furthermore also have very good heat-conducting properties such that they are able to dissipate well or distribute uniformly the thermal loads input during the operation of the reflective optical component.

As an alternative to the materials mentioned above, the base body can preferably be produced from a material selected from the group consisting of polymeric materials, such as PMMA or other plastics.

These materials, too, which are even more cost-effective than the previously mentioned materials, are suitable for working in a microstructuring by conventional methods, e.g. by hot embossing using a stamp, moulding, casting or injection-moulding into a structured shape.

As an alternative to the abovementioned configuration, according to which the microstructuring is worked directly into the base body, it is likewise preferred if, prior to working in the microstructuring, a structuring layer, preferably composed of a material softer than the material of the base body, is applied to the base body, and wherein the microstructuring is worked into the structuring layer.

In the case of the component according to the invention, correspondingly the microstructuring is present in a structuring layer, preferably composed of a material softer than the material of the base body, the structuring layer being arranged on the base body.

In this case, it is advantageous that the base body as such can be produced from a material which is less well suited to introduce a microstructuring, which in other words can be either hard and/or brittle. In this case, the base body can be produced e.g. from a vitreous material, such as quartz or from a glass ceramic (ULE, Zerodur and the like). Generally, this configuration makes it possible to produce the base body as such from any desired material, wherein the structuring layer suitable for introducing a microstructuring is applied to the base body, and the microstructuring is worked into the structuring layer, e.g. by the conventional microstructuring methods mentioned above.

In particular, in this configuration, the base body can be produced from a material which is particularly suitable for dissipating thermal power that has been input, because it has a high thermal conductivity, e.g. a material from the group of metals or semiconductors or the composite materials thereof, such as copper, aluminium, molybdenum, tungsten, silicon, silicon carbide, SiSiC, AlN, AlSiC, $Si_3N_4$, AlSiC alloys.

Furthermore, in this configuration, the base body can be produced from a material distinguished particularly by low thermal expansion, such as e.g. brittle-hard glass or ceramic materials such as quartz, silicon, silicon carbide, SiSiC, ULE, Zerodur.

In the case of this configuration, too, it is preferred if a soft material selected from the group consisting of metals, metal alloys, semiconductors and the compounds thereof, in particular aluminium, copper, gold, silver, platinum, NiP, crystalline silicon, amorphous silicon and other soft metals or materials is applied as the structuring layer.

Likewise, in one preferred configuration, a material selected from the group consisting of polymeric materials, such as cured photoresist or PMMA, can be applied as the structuring layer.

When applying the structuring layer, the latter should be as homogeneous as possible over the area of the substrate, in order to enable homogeneous processing of the structuring layer for introducing the microstructuring, which improves the quality of the microstructuring to be produced and hence the quality of the optical properties of the finished reflective optical component.

If a structuring layer is applied to the base body for the purpose of introducing the microstructuring, it can be advantageous, prior to applying the structuring layer, to apply an adhesion promoting layer to the base body.

In the case of the component according to the invention, correspondingly an adhesion promoting layer can be present between the base body and the structuring layer.

This measure is advantageous particularly when the material of the base body, for example owing to lack of conductivity, is not readily suitable for applying the structuring layer via a method such as electrodeposition, or when the material of the base body is not suitable for applying the structuring layer by vapour deposition or sputtering, at least not to the extent that the structuring layer can form an intimate composite with the base body. In this case, the adhesion promoting layer can be of assistance here.

In a further preferred configuration of the method, after introducing the microstructuring, the microstructured surface is polished directly.

In the case of the component according to the invention, it is correspondingly preferably provided that the polished surface is the microstructured surface itself.

This measure is suitable particularly when the material into which the microstructuring has been worked is nevertheless sufficiently hard, such that it is suitable for polishing. If the material into which the microstructuring has been worked is also suitable for polishing, as is the case e.g. for the material NiP, (amorphous or crystalline) silicon, quartz or copper, this measure has the advantage that applying a further layer, which would then be polished, can be obviated, thereby saving time and costs during the production of the optical component.

As an alternative thereto, in one preferred configuration of the method, it is provided that prior to polishing, a polishing layer, preferably composed of a material harder than the material of the microstructured surface, is applied to the microstructuring, wherein the polishing layer is polished.

In the case of the component according to the invention, correspondingly the polished surface is a surface of a polishing layer which is arranged on the microstructuring and comprises a material that is preferably harder than the material of the microstructured surface.

In this case, the polishing layer does not have to be arranged directly on the microstructuring, rather it is also possible for one or plurality of other layers to be situated between the polishing layer and the microstructuring.

The advantage of this measure is that, firstly, the material of the base body or of the structuring layer into which the microstructuring is worked can be a soft material particularly well suited to the microstructuring, while for the polishing layer a material is then chosen which can be polished, in particular superpolished, particularly well. The provision of a polishing layer has the advantage that the polishing layer can be correspondingly chosen to reduce the polishing time and to obtain the microstructuring in the best possible manner.

The polishing layer preferably comprises a material selected from the group consisting of vitreous materials, such as amorphous silicon, crystalline silicon or quartz, or of metallic materials, such as e.g. NiP or copper.

These materials are sufficiently hard and dense and are therefore suitable, in particular, as material for the polishing layer.

In a further preferred configuration of the method, the microstructuring is worked in with a structure reserve, which takes into account a removal of material by the polishing.

This measure is particularly advantageous, if the microstructured surface is directly polished according one of the preferred configurations mentioned before. The microstructuring can change in undesired fashion by the polishing. This can be counteracted by virtue of the fact that the microstructuring is worked in with a structure reserve, which takes into account the expected changes of the microstructuring by the polishing.

For example, the depth of the microstructuring can become smaller by the polishing. This can be balanced by a configuration of the microstructuring which is initially deeper so that the depth of the structures is optimum after the polishing. This procedure can also be carried out on the optical component in a locally different way, in order to balance local differences of the polishing process.

Further, in case of the configuration of the microstructuring as grating structure, the shape of the edges of the structures can be altered by the polishing in disadvantageous fashion; for example, the edges of the structures of the microstructuring can become rounder by the polishing. This can be prevented by a structure reserve, when working in the microstructuring, in such a way that the microstructuring is worked in with opposite roundnesses or curvatures. For example, in case the polishing leads to a rounding off of the edges of the microstructuring so that convexly curved surfaces are the result of the polishing, this can be balanced by a structure reserve, when working in the microstructuring, such that the microstructuring is worked in with concave roundnesses or curvatures.

In a further preferred configuration of the method, a protective layer as final layer is applied to the reflective layer, which reflective layer, depending on the configuration of the method, is applied to the microstructuring directly or to the polishing layer.

In the case of the component according to the invention, correspondingly a protective layer as final layer is present on the reflective layer.

This measure has the advantage that the finished reflective optical component is protected by the protective layer in particular against mechanical influences and/or against the influence of gases which could attack the layers situated below the protective layer.

In a further preferred configuration of the component according to the invention, the microstructuring is embodied as a wavelength-selective filter, e.g. as a diffraction grating.

In this configuration, the microstructuring is suitable for filtering out undesired spectral ranges from the EUV radiation, such as UV radiation or IR radiation.

In a further preferred configuration, the microstructuring is embodied as diffraction grating which has ribs and grooves in alternating fashion, wherein each of the ribs and each of the grooves have a surface substantially parallel to a light entrance surface of the component, and wherein the ribs and the grooves have flanks, respectively, which are substantially parallel to an optical axis of the component.

This configuration of the microstructuring, which can also be referred to as binary grating structure, is advantageously suited as wavelength selective filter for suppressing a wavelength or a wavelength range of electromagnetic radiation impinging on the optical component. In case of use of the optical component as microstructured EUV collector mirror, for example, it is desirable to suppress the wavelength or the wavelength range of the laser radiation, which is used for generating the EUV radiation so that the laser radiation which is in the infrared or near infrared and the power of which is several kilowatts, can be reliably coupled out from the beam path of the EUV radiation and destroyed.

When the surface of the component is not curved, the ribs and grooves form a rectangular profile in cross-section along a plane which is parallel to the optical axis of the component. If the surface of the component is concavely or convexly curved, the surfaces of the ribs and the grooves facing the light entrance surface of the optical component are curved according to the curvature of the optical component.

A depth h of the grooves (or a height h of the ribs) preferably and at least approximately meets the following condition at at least one portion of the diffraction grating: $h = n \cdot \lambda/4$, wherein $\lambda$ is the wavelength of electromagnetic radiation to be suppressed by the diffraction grating, and n is an odd integer.

If the microstructuring configured as a binary grating has a depth h of the grooves or a height h of the ribs, the binary grating then optimally suppresses wavelengths $\lambda$ of 4 h and 4 h/n in the direct reflection, i.e. in the 0. diffraction order, when the radiation incidence is perpendicular to the surface of the component. A binary grating is optimum with respect to this characteristic in comparison with other grating structure shapes.

With non-perpendicular incidence of the electromagnetic radiation, the depth of the grooves or the height h of the ribs is to be chosen higher, accordingly.

It is further preferred if the depth h of the grooves or the height h of the ribs locally varies over the diffraction grating.

In this case, it is advantageous that locally different angles of incidence of the electromagnetic radiation can be taken into account by the locally different depth of the binary grating structures over the diffraction grating in order to reliably suppress radiation, the angle of incidence of which varies over the optical component.

Preferably, the rib widths of the ribs and the groove widths of the grooves are equal at at least one portion of the diffraction grating.

This particularly simple configuration of the microstructuring as a binary grating is suited for perpendicular incidence of the electromagnetic radiation which is to be suppressed.

A preferred configuration, however, provides that a grating constant of the diffraction grating, i.e. the distance of neighbouring ribs or neighbouring grooves, locally varies over the diffraction grating.

By virtue of the locally different grating constant of the diffraction grating, a carefully directed control of the impact site of the diffracted and suppressed electromagnetic radiation, for example infrared or near infrared radiation of high power, can be realized. The electromagnetic radiation which is diffracted out and suppressed must be destroyed in an EUV system, wherein, to this end, the electromagnetic radiation which is diffracted out and suppressed is directed onto a cooling body. In order to avoid that the total electromagnetic radiation which is diffracted out and suppressed impacts a very small local area of the impact surface of the cooling body, which could lead to a melting of the cooling body due to the extremely high power of the radiation, the aforementioned measure has the advantage that the electromagnetic radiation which is diffracted out and suppressed can be areally distributed onto the impact surface of the cooling body so that a destruction of the cooling body can be avoided by suited simple cooling measures. In other words, the electromagnetic radiation which his diffracted out and suppressed is "spread out" by the locally varying grating constant of the diffraction grating.

The component according to the invention is preferably a collector mirror of an EUV projection exposure apparatus. The collector mirror can be operated with oblique, in particular grazing, incidence or with normal incidence.

Further advantages and features are evident from the following description and the accompanying drawing.

It goes without saying that the features mentioned above and those yet to be explained below can be used not only in the combination respectively indicated, but also in other combinations or by themselves, without departing from the scope of the present invention.

Figure 2:
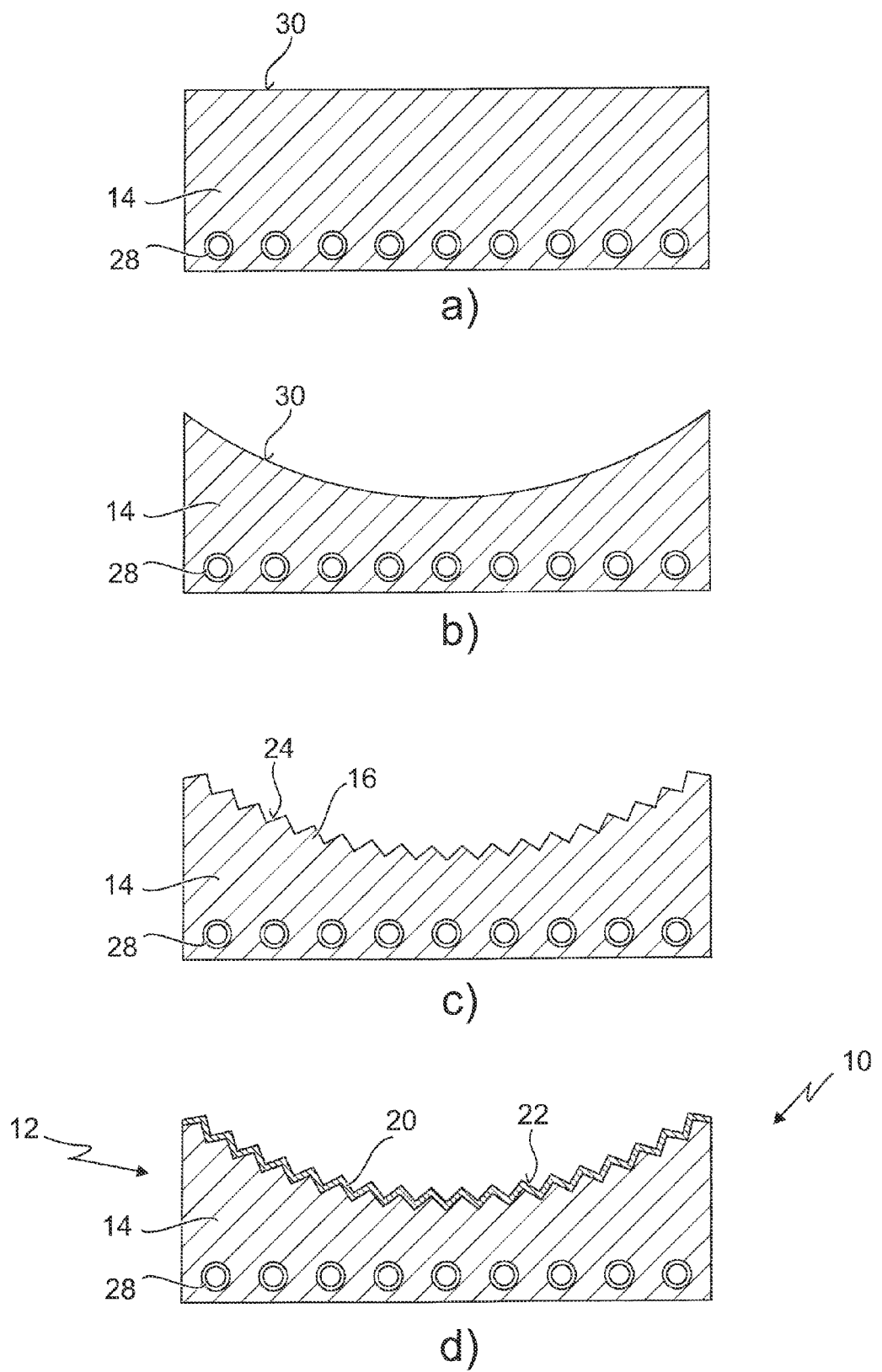
Figure 3:
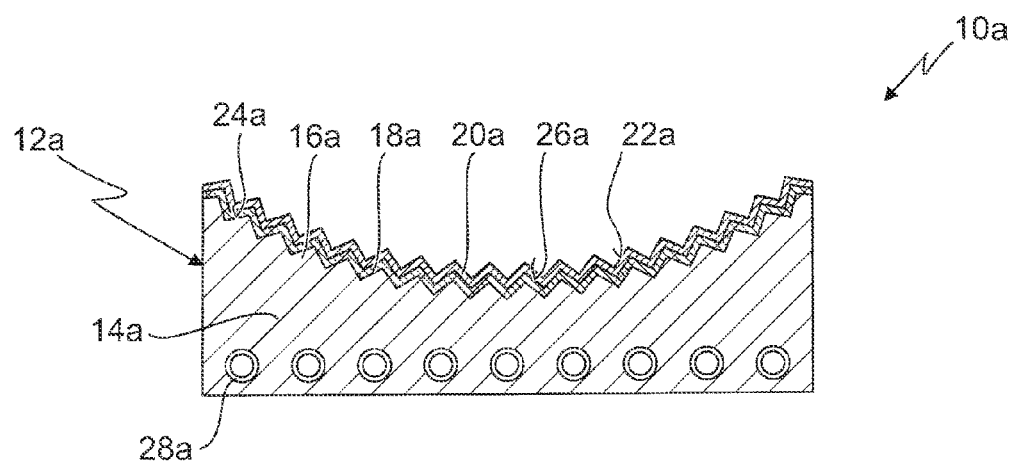
Figure 4:
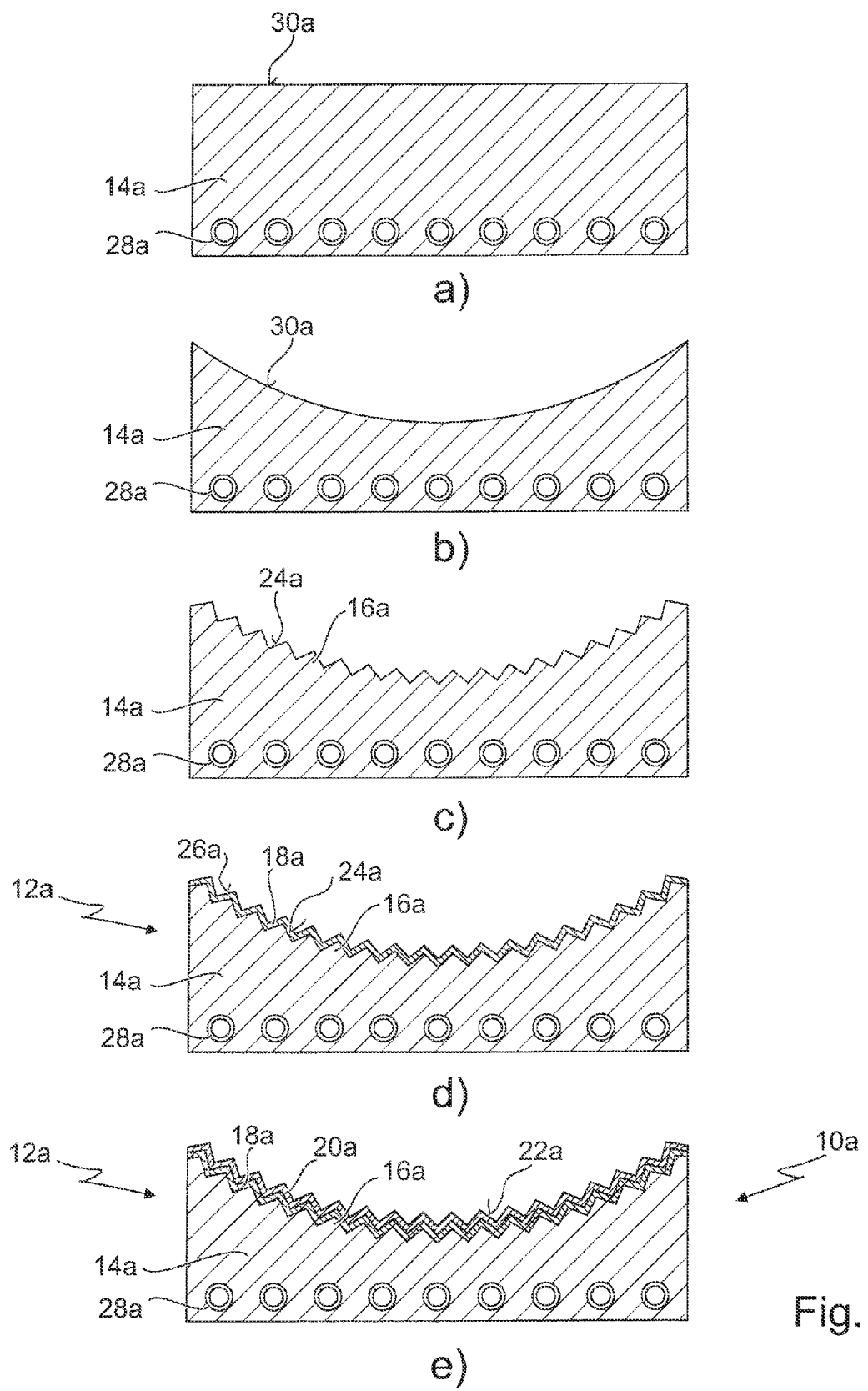
Figure 5:
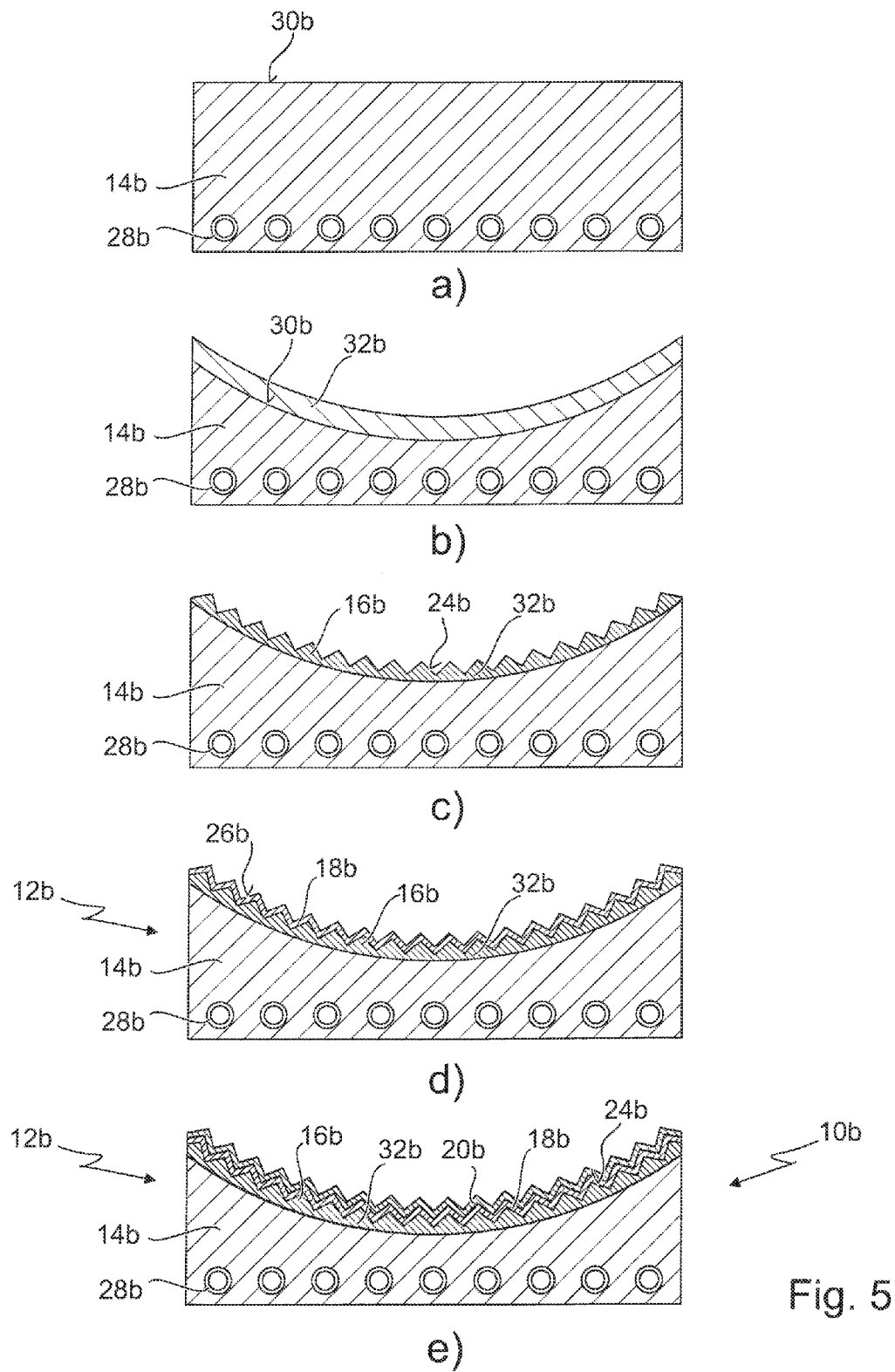
Figure 6:
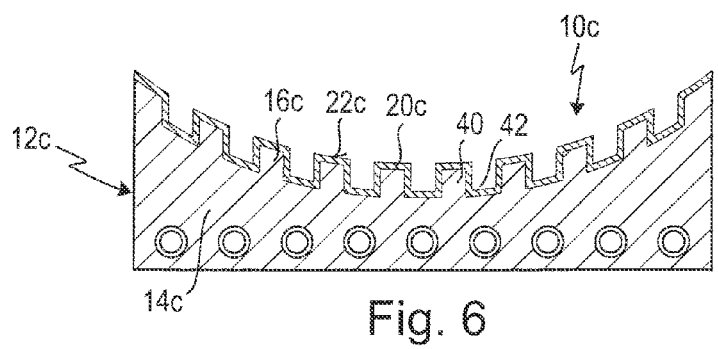
Figure 7:
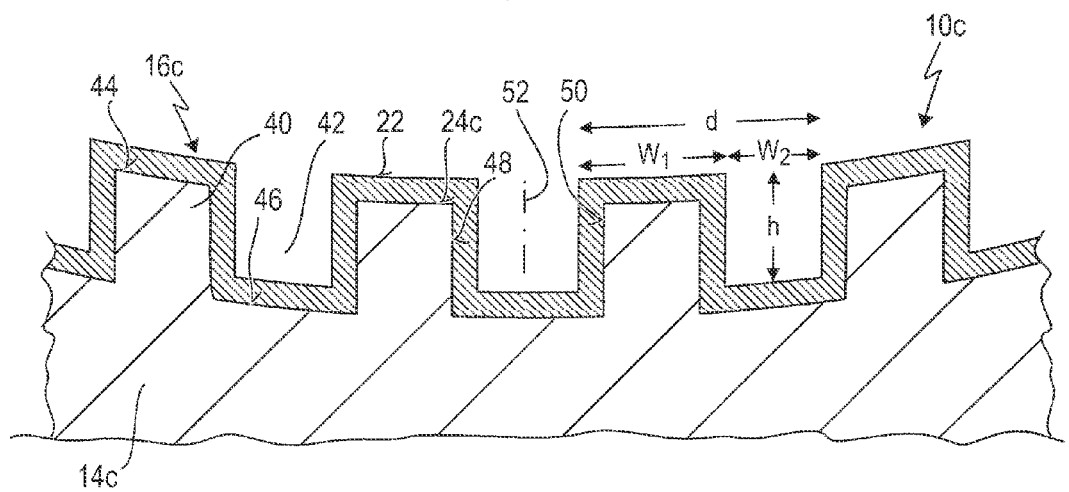

Exemplary embodiments of the invention are illustrated in the drawing and are described in greater detail hereinafter with reference thereto. In the figures:

FIG. 1 shows a reflective optical component for an EUV projection exposure apparatus in a schematic sectional view in accordance with a first exemplary embodiment;

FIGS. 2a) to d) show a method for producing the reflective optical component in FIG. 1;

FIG. 3 shows a reflective optical component for an EUV projection exposure apparatus in a schematic sectional view in accordance with a further exemplary embodiment;

FIGS. 4a) to e) show a method for producing the reflective optical component in FIG. 3; and FIGS. 5a) to e) show a further exemplary embodiment—modified relative to the method in FIGS. 2a) to d) and 4a) to e)—of a method for producing a reflective optical component illustrated in FIG. 5e);

FIG. 6 a reflective optical component for an EUV projection exposure apparatus in a schematic sectional view in accordance with a further exemplary embodiment;

FIG. 7 a detail of the component in FIG. 6 in an enlarged scale; and

Figure 8:
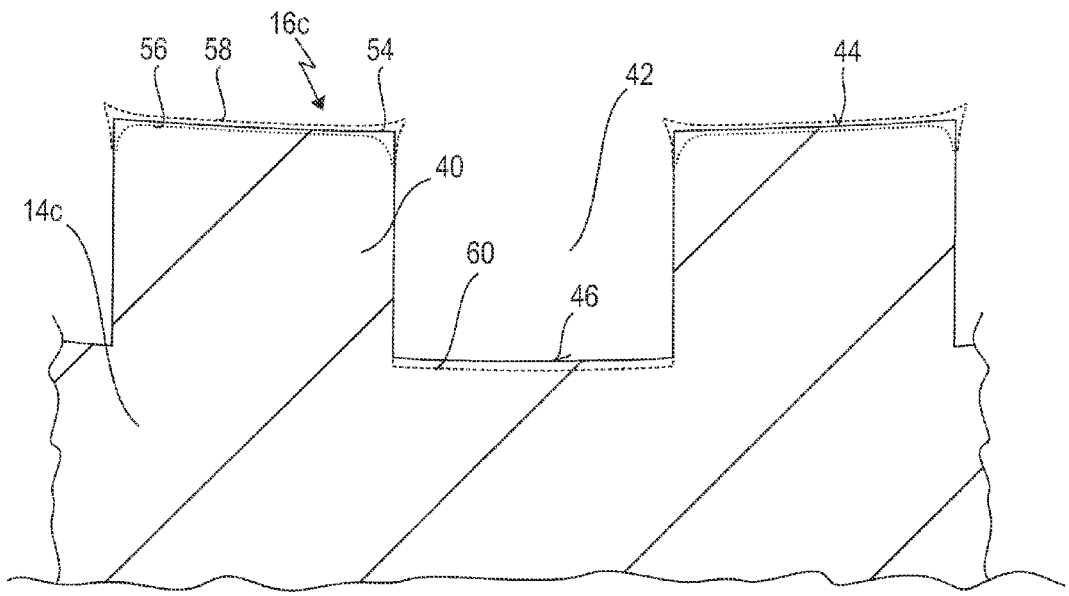

FIG. 8 a detail of the optical component in FIGS. 6 and 7 in a still further enlarged scale and in an intermediate stage of the production of the optical component.

FIG. 1 illustrates a reflective optical component for an EUV projection exposure apparatus, the reflective optical component being provided with the general reference sign 10.

The reflective optical component 10 can be embodied as an EUV collector mirror used in the EUV radiation source. However, the component 10 can also be a mirror used in an EUV projection exposure apparatus in a projection lens or an illumination system of the projection exposure apparatus. The component 10 can also be embodied as a mirror array, in a particular as a micromirror array.

Generally, the optical component 10 has a substrate 12 having a base body 14, into which an optically operative microstructuring 16 is worked. The optically operative microstructuring 16 is embodied here in the form of a schematically illustrated diffraction grating. However, the microstructuring 16 illustrated in FIG. 1 should be understood merely by way of example, and can represent any other optically operative microstructuring which can be used to impart a specific optical property to the optical component 10. In the exemplary embodiment shown, the microstructuring 16 serves as a wavelength-selective filter in order, in the case where the optical component 10 is used in an EUV projection exposure apparatus, to filter out specific wavelengths of the radiation or to ensure that only radiation having a specific wavelength propagates as used light in the projection exposure apparatus.

The base body 14 provided with the microstructuring 16 is adjoined by a reflective layer 20. During the operation of the optical component 10, a surface 22 of the reflective layer 20 represents the surface to which the light or radiation is applied.

In the exemplary embodiment in accordance with FIG. 1, the base body 14 overall is produced from a material suitable for working in the optically operative microstructuring 16 into the material by a conventional method, such as e.g. microlithography, diamond turning or milling, holography or nano-imprint.

In this case, the base body 14 can be produced overall from a metal, a metal alloy, a semiconductor or a compound of the aforementioned materials. By way of example, the base body 14 can be produced from aluminium, an aluminium alloy, copper, a copper alloy, silicon, an aluminium-silicon alloy or from nickel. What is important here is that the material of the base body 14 is well suited to working in firstly the here concavely curved surface shape and secondly the microstructuring 16.

A surface 24 of the microstructuring 16 is a polished surface which meets the requirements made of microroughness, which should typically be less than 0.2 nm rms.

The reflective layer 20 is e.g. a molybdenum/silicon multilayer such as is customary in EUV applications.

Furthermore, cooling lines 28 are present in the base body 14 through which cooling lines e.g. a cooling medium is conducted in order to cool the substrate 12 and hence the optical component 10.

Referring to FIGS. 2a) to d) a method for producing the optical component 10 in FIG. 1 will now be described.

FIG. 2a) shows the step of providing the base body 14. In this case, the base body 14 is produced overall from a material suitable for introducing a microstructuring, as indicated above. By way of example, the base body 14 can be produced from aluminium, an aluminium alloy, copper, a copper alloy, silicon, an aluminium-silicon alloy or from nickel. The cooling lines 28 have already been provided in the base body 14.

In the next step in accordance with FIG. 2b), a surface 30 of the base body 14 is then processed in order to obtain the surface shape of the surface 30 in accordance with FIG. 2b). Conventional machining processing methods can be used for this purpose.

In the next step in accordance with FIG. 2c), the microstructuring 16 is worked into the surface 30 of the base body 14. The microstructuring 16 can be worked by conventional methods such as e.g. microlithography, diamond turning or milling, holography or nano-imprint. In this case, it is not necessary for the method used for working in the microstructuring already to produce the necessary microroughness for the application of the component 10 as an EUV mirror.

Consequently, the surface 24 of the microstructuring 16 does not yet meet the stringent requirements made of microroughness.

In order to meet the stringent requirements made of microroughness, the surface 24 of the microstructuring 16 is polished, in particular superpolished. During the polishing of the surface 24, the surface structure of the microstructuring 16 should be maintained as well as possible in the material of the base body 14.

The surface 24 is polished e.g. via a conventional wet polishing method.

After the surface 24 of the microstructuring 16 has been polished, the reflective layer 20, e.g. in the form of a silicon/molybdenum multilayer is then applied to the polished surface 24 of the microstructuring 16.

The configuration of the optical component 10 wherein the microstructuring 16 is worked into the material of the base body 14 and wherein the surface 24 of the microstructuring 16 is subsequently polished is advantageous particularly when the material of the base body 14 is one which, on the one hand, is sufficiently soft for introducing the microstructuring 16, but sufficiently hard to be subsequently polished. Materials for the base body 14 which are correspondingly suitable are e.g. copper, silicon or nickel.

FIG. 3 illustrates a further exemplary embodiment of a reflective optical component for an EUV projection exposure apparatus, the reflective optical component being provided with the general reference sign 10a.

The optical component 10a has a substrate 12a having a base body 14a, into which an optically operative microstructuring 16a is worked as in the previous exemplary embodiment.

In contrast to the previous exemplary embodiment, the surface 24a of the microstructuring 16a is not a polished surface, rather the base body 14a provided with the microstructuring 16a is adjoined by a polishing layer 18a, which is then adjoined by the reflective layer 20a.

This configuration of the optical component 10a with the additional polishing layer 18a enables a higher flexibility in the selection of the material of the base body 14a. This is because the material of the base body 14a, in this configuration, only has to be suitable for enabling the microstructuring 16a to be introduced easily into the material of the base body 14a by conventional methods, but the material does not also have to be suitable for polishing, in particular superpolishing, in order to obtain the required microroughness. Consequently, for the material of the base body 14a it is possible to choose particularly soft materials, such as aluminium or copper or even polymeric materials such as PMMA and other plastics.

Specifically, the polishing layer 18 can be chosen from a material harder than the material of the base body 14a, e.g. quartz, amorphous or crystalline silicon, but other amorphous, crystalline or polycrystalline layers are also conceivable as polishing layer 18. Metals such as copper or metal compounds such NiP are also suitable as materials for the polishing layer 18. The polishing time can be reduced by a suitable choice of the material of the polishing layer 18a.

FIGS. 4a) to e) now illustrate a method for producing the optical component 10a in FIG. 3.

In accordance with FIG. 4a), firstly the base body 14a is provided. In this case, the base body 14a is produced overall from a material which is suitable for introducing, i.e. working in a microstructuring, the material being correspondingly soft. By way of example, the base body 14a can be produced from a particularly soft material, as already explained above. The cooling lines 28a have already been provided in the base body 14a.

In the next step in accordance with FIG. 4b), a surface 30a of the base body 14a is then processed in order to obtain the surface shape of the surface 30a in accordance with FIG. 4b).

In the next step in accordance with FIG. 4c), the microstructuring 16a is worked into the surface 30a of the base body 14a. On account of the softness of the material, the process of introducing the microstructuring 16a can be carried out by conventional methods, as described above.

In the next step in accordance with FIG. 4d), the polishing layer 18a is applied to the surface 24a of the microstructuring 16a, and the polishing layer 18a is subsequently polished, in particular superpolished, in order thus to obtain a polished surface 26a.

The polishing layer 18a is applied with a thin layer thickness. The polishing layer 18 can be e.g. a quartz layer or an amorphous or crystalline silicon layer.

The polishing layer 18a is polished by a conventional wet polishing method, such that the surface shape of the surface 24a of the microstructuring 16a is maintained, but on the other hand the required microroughness is obtained. The polishing layer 18 is typically not polished to such an extent that the layer 18a disappears, rather the latter remains on the surface 24a of the microstructuring 16a and thus serves as an actual substrate surface for the further application of the reflective layer 20a in accordance with FIG. 4e.

The thickness of the polishing layer 18a is e.g. in a range of from approximately 0.5 µm to approximately 100 µm. The polishing layer 18a is present continuously across the area of the substrate 12 after polishing.

In the exemplary embodiment of the optical component 10a, therefore, the base body 14a is optimized with regard to the process of working in the microstructuring 16a, while the polishing layer 18a is optimized with regard to its polishability, in order thus to achieve a microroughness of less than 0.2 nm rms.

FIGS. 5a) to e) illustrate a method—modified relative to the method in accordance with FIGS. 2a) to d) and the method in accordance with FIGS. 4a) to e)—for producing a reflective optical component 10b in accordance with FIG. 5e).

In accordance with FIG. 5a), the first step again involves providing a base body 14b, having a surface 30b and cooling lines 28b that have already been worked into the base body 14b.

In contrast to the base body 14 or 14a, the base body 14b can be produced from any desired material, in particular also one which is not suitable for working in a microstructuring 16b (see FIG. 5e)). Consequently, the base body 14b can also be composed of a hard and/or brittle material, e.g. composed of a ceramic or glass ceramic (e.g. ULE, Zerodur). Nevertheless, however, the base body 14b can also be produced from one of the abovementioned materials for the base body 14 or 14a. In addition to the abovementioned materials for the base body 14 or 14a, the appropriate materials include e.g. silicon carbide, SiSiC, molybdenum, tungsten, AlN, AlSiC, $Si_3N_4$, Al—SiC alloys.

Firstly, in accordance with FIG. 5b), the surface 30b of the base body 14b is processed in order to obtain the desired surface shape, which is illustrated here once again as concave.

Since the material of the base body 14b is possibly too hard or brittle for producing the microstructuring 16b, a structuring layer 32b composed of a material suitable for working in the microstructuring 16b by conventional methods, as described above, is subsequently applied to the surface 30b. The structuring layer 32b is therefore preferably once again a layer composed of a metal, a metal alloy, a semiconductor or the compounds thereof, in particular NiP, copper, aluminium, gold, silver, platinum metals, amorphous silicon, or quartz or composed of a polymer, such as e.g. cured photoresist, PMMA and the like.

The structuring layer 32b can be applied by vapour deposition or sputtering, plating or chemical coating and, in the case where the structuring layer 32b is produced from a polymeric material, also by spraying, spin-coating or resist coating.

For the case where the structuring layer 32b is intended to be applied galvanically, for example, but the material of the base body 14b is not or not sufficiently conductive, an adhesion promoting layer, e.g. composed of aluminium, chromium or the like, can be applied prior to the process of applying the structuring layer 32b to the surface 30b of the base body 14b. The structuring layer 32b can, for example, then be composed of a metal or a metal alloy, a metal compound, e.g. NiP, be applied galvanically to the base body 14b. However, not only for the case where the structuring layer 32b is applied galvanically, but also in the case of other methods for applying the structuring layer 32b, the prior application of an adhesion promoting layer may be advantageous depending on the materials used.

In accordance with FIG. 5c), a microstructuring 16b is then worked into the structuring layer 32b as described with reference to FIG. 2c) or 4c).

Afterwards, a polishing layer 18b can be applied to the microstructuring 16b and can be polished, as described with reference to FIG. 4d), and a reflective layer 20b is subsequently applied.

In a departure therefrom, however, it is possible, if the material of the structuring layer 32b is suitable for this purpose, to omit the polishing layer 18b and in return to polish the surface 24b of the structuring layer 32b as has been described above with reference to the optical component 10 and the method for producing the latter. If the structuring layer 32b is formed e.g. from NiP or copper or silicon, the surface 24b of the microstructuring 16b can also be polished directly.

In all of the exemplary embodiments described above, a final protective layer can be applied to the reflective layer 20, 20a or 20b.

In the exemplary embodiment in accordance with FIG. 1 and FIGS. 2a) to d) and in the exemplary embodiment in accordance with FIG. 3 and FIGS. 4.a) to e), it is likewise possible to mould the base body 14 or 14a, if appropriate together with the optically active microstructuring 16, in a moulding method from a mouldable material, e.g. a metal or a polymer, or to produce the base body 14 or 14a together with the microstructuring 16 or 16a in an injection-moulding method.

What is common to all the exemplary embodiments mentioned above is that the microstructuring 16, 16a or 16b is worked into the substrate 12, 12a, 12b before the substrate 12, 12a or 12b is polished, and the reflective layer 20, 20a or 20b is implemented after the microstructuring 16, 16a or 16b has been worked in and after the substrate 12, 12a or 12b has been polished.

With reference to FIGS. 6 through 8, a further exemplary embodiment of a reflective optical component 10c for an EUV projection exposure apparatus will be described. The reflective component 10c is a modification of the optical component 10 in FIG. 1 with respect to the configuration of the microstructuring of the component 10c.

The reflective optical component 10c has a substrate 12c having a base body 14c into which an optically operative microstructuring 16c is worked. The base body 14c is adjoined by a reflective layer 20c, a surface 22c of which represents the surface of the optical component 10c to which light or radiation is applied during the operation of the optical component 10c.

With respect to the selection of the material of the base body 14c and the production of the optical component 10c, reference can be made to the corresponding description of the optical component 10, wherein only the differences of the optical component 10c and of its production with respect to the optical component 10 will be described in the following.

The microstructuring 16c of the optical component 10c is embodied in form of a diffraction grating which has ribs 40 and grooves 42 in alternating fashion.

FIG. 7 shows a detail of the optical component 10c in an enlarged scale. The ribs 40 of the microstructuring 16c each have a surface 44 substantially parallel to a light entrance surface 22c of the optical component 10c, and the grooves 42 each have a surface 46 which is also substantially parallel to the light entrance surface 22c. "Substantially parallel" is to be understood here such that the surfaces 44 and 46 are adapted to the curved surface 22c of the optical component 10c as shown in the exemplary embodiment by providing the surfaces 44 and 46 with a corresponding curvature. If such an optical component is configured plane instead of concavely curved as shown, the microstructuring 16c has, in a strict sense, the shape of a rectangular profile.

The ribs 40 and the grooves 42 each have flanks 48, 50 which are substantially parallel to an optical axis 52 of the optical component 10c.

The microstructuring 16c of the optical component 10c is also denoted as binary grating.

Such a binary grating is particularly suited for suppressing a wavelength or a wavelength range of perturbing electromagnetic radiation, for example infrared or near infrared radiation which is used for generating EUV radiation, and which impinges on the optical component 10c.

The ribs 40 have a rib width $w_1$, and the grooves 42 have a groove width $w_2$. The rib width $w_1$ and the groove width $w_2$ are equal at least portionwise over the diffraction grating. A grating constant d is the sum of the rib width $w_1$ and the groove width $w_2$.

A depth of the grooves 42 or a height of the ribs 40 is labelled with h in FIG. 7.

The depth h of the grooves 42 or the height of the ribs 40, respectively, at least approximately meets the condition: $h = n \cdot \lambda/4$, wherein $\lambda$ is the wavelength of electromagnetic radiation which is to be suppressed, and n is an odd integer.

For perpendicular incidence of the electromagnetic radiation which is to be suppressed, the depth h or the height h is at least approximately chosen such that the condition $h = n \cdot \lambda/4$ is met, while the depth h or the height h of the binary grating structure is to be chosen higher, accordingly, for non-perpendicular incidence of the electromagnetic radiation which is to be suppressed.

Ideally, the height h or depth h can locally vary over the diffraction grating in order to take into account the local different angles of incidence of the electromagnetic radiation which is to be suppressed.

The rib width $w_1$ and the groove width $w_2$ can be equal at least portion-wise, but can also locally vary. Preferably, in particular the grating constant d varies locally, in order to direct the electromagnetic radiation which is to be suppressed in different directions so that the electromagnetic radiation which is suppressed and diffracted out can be directed onto different impact sites of one or more cooling bodies (not shown), in order to avoid a too high local heat load of this cooling body or these cooling bodies.

FIG. 8 shows a detail of the microstructuring 16c of the optical component 10c in a still further enlarged scale, before the reflective layer 20c is applied.

A solid line 54 shows the ideal contour of the microstructuring 16c as it should be present after the polishing process, so that, after applying the reflective layer 20c, the surface 22c of the reflective layer 20c follows this contour, too.

However, the polishing process, in particular if the surface 24c of the microstructuring 16c is directly polished, i.e. without previously applying a polishing layer, results in a removal of material of the surface of the microstructuring 16c.

If the microstructuring 16c would be already worked in with the "ideal" contour according to the solid line 54 and then polished, it can happen that the microstructuring 16c has a contour after the polishing, as, for example, shown by the broken line 56 in FIG. 8. In particular, the edges of the binary grating structure can be rounded off in undesired fashion as indicated by the broken line 56. In order to take into account the expected removal of material, the microstructuring 16c therefore is worked in with a structure reserve as illustrated in exemplary fashion in FIG. 8 by a broken line 58. The structure reserve according to the line 58 substantially is opposite to the contour 56 which is to be expected after the polishing process if the microstructuring would be already worked in with the "ideal" contour 54. In case the microstructuring 16c is worked in with a structure reserve according to the contour 58, the microstructuring 16c has the "ideal" contour 54 after the polishing.

It is to be understood that the broken line 58 is only an example of a structure reserve when working in the microstructuring 16c.

For example, a structure reserve can be furthermore carried out by working in the grooves 42 or the ribs 40 with a greater depth or height h as shown by a broken line 60 in FIG. 8

Finally, arbitrary other structure reserves can be taken into consideration in order to take into account the expected removal of material by the polishing of the microstructuring 16c.

It is to be understood that the microstructuring 16c described with reference to the optical component 10c can also be applied to the optical components 10a or 10b, i.e. regardless whether the microstructuring is directly worked into the base body or into a structuring layer, or regardless whether a polishing layer is additionally applied to the microstructuring, as described above with reference to the other exemplary embodiments.

The invention claimed is:

1. A method, comprising:
working an optically operative microstructuring into an initial substrate to provide a microstructured substrate;
applying a polishing layer to the microstructured substrate;
polishing the polishing layer to provide a polished, polishing layer having a surface with a roughness of less than 0.2 nanometer rms; and
applying a reflective layer to the polished, polishing layer, wherein:
the reflective layer has a surface roughness of less than 0.2 nanometer rms; and
the reflective layer is configured to reflect EUV radiation.

2. The method of claim 1, wherein the initial substrate comprises a material selected from the group consisting of metals, metal alloys, semiconductors and the compounds thereof.

3. The method of claim 1, wherein the initial substrate comprises a polymeric material.

4. The method of claim 1, wherein the initial substrate further comprises a base body and an adhesion promoting material is between the base body and the polishing layer.

5. The method of claim 1, wherein:
the polishing layer comprises a material that is harder than the microstructured substrate.

6. The method of claim 1, further comprising, after applying the reflective layer to the polished, polishing layer, providing a protective layer which is supported by the reflective layer.

7. A component, comprising:
a substrate comprising an optically operative microstructuring;
a polishing layer supported by the optically operative microstructuring, the polishing layer having a surface with a roughness of less than 0.2 nanometer rms; and
a reflective layer supported by the surface of the polishing layer,
wherein a surface of the reflective layer has a roughness of less than 0.2 nanometer rms, and the reflective layer is configured to reflect EUV radiation.

8. The component of claim 7, wherein the initial substrate comprises a material selected from the group consisting of metals, metal alloys, semi-conductors and the compounds thereof.

9. The component of claim 7, wherein the base body comprises a polymeric material.

10. The component of claim 7, wherein the polishing layer comprises a material that is softer than the substrate.

11. The component of claim 7, wherein the polishing layer is harder than the substrate.

12. The component of claim 7, further comprising a protective material supported by the reflective layer.

13. The component of claim 7, wherein the optically operative microstructuring is a wavelength-selective filter.

14. The component of claim 7, wherein the optically operative microstructuring is a diffraction grating comprising ribs and grooves in alternating fashion, each rib and each groove having a surface substantially parallel to a light entrance surface of the component, and the ribs and the grooves having flanks substantially parallel to an optical axis of the component.

15. The component of claim 7, wherein a grating constant locally varies over the diffraction grating.

16. The component of claim 7, wherein the component is a collector mirror.

* * * * *

UNITED STATES PATENT AND TRADEMARK OFFICE
CERTIFICATE OF CORRECTION

PATENT NO. : 9,541,685 B2  
APPLICATION NO. : 13/971031  
DATED : January 10, 2017  
INVENTOR(S) : Holger Kierey et al.

Page 1 of 1

It is certified that error appears in the above-identified patent and that said Letters Patent is hereby corrected as shown below:

In the Specification

Column 14, Line 57, after "FIG. 8", insert -- . --.

In the Claims

Column 15, Line 9, Claim 1, delete "polished," and insert -- polished --.

Column 15, Line 12, Claim 1, delete "polished," and insert -- polished --.

Column 15, Line 31, Claim 6, delete "polished," and insert -- polished --.

Signed and Sealed this
Fourth Day of July, 2017

Joseph Matal
*Performing the Functions and Duties of the*
*Under Secretary of Commerce for Intellectual Property and*
*Director of the United States Patent and Trademark Office*